US007728742B2

(12) United States Patent
Gonion

(10) Patent No.: US 7,728,742 B2
(45) Date of Patent: Jun. 1, 2010

(54) METHOD AND APPARATUS FOR COMPRESSING AND DECOMPRESSING DATA

(75) Inventor: Jeffry E. Gonion, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/495,568

(22) Filed: Jun. 30, 2009

(65) Prior Publication Data

US 2010/0079313 A1  Apr. 1, 2010

Related U.S. Application Data

(63) Continuation-in-part of application No. 12/241,785, filed on Sep. 30, 2008.

(51) Int. Cl.
*H03M 7/00* (2006.01)
(52) U.S. Cl. .......................................... 341/60; 341/67
(58) Field of Classification Search .................. 341/50, 341/51, 55, 67, 65, 60; 370/389, 413
See application file for complete search history.

(56) References Cited

U.S. PATENT DOCUMENTS

| | | | |
|---|---|---|---|
| 5,138,315 A | 8/1992 | Queau | |
| 5,381,145 A | 1/1995 | Allen | |
| 5,982,306 A * | 11/1999 | Nam | ........................... 341/67 |
| 6,118,898 A | 9/2000 | Chen | |
| 6,304,197 B1 | 10/2001 | Freking | |
| 6,597,812 B1 | 7/2003 | Fallon | |
| 6,621,428 B1 | 9/2003 | Crane | |
| 6,661,845 B1 | 12/2003 | Herath | |
| 6,668,015 B1 | 12/2003 | Kranawetter | |
| 6,862,278 B1 * | 3/2005 | Chang et al. | ................. 370/389 |
| 6,947,413 B2 * | 9/2005 | Wakabayashi et al. | ...... 370/358 |
| 7,071,852 B1 | 7/2006 | Wegener | |
| 7,071,935 B1 | 7/2006 | Deering | |
| 7,148,822 B2 * | 12/2006 | Suzuki | ......................... 341/67 |
| 7,180,901 B2 | 2/2007 | Chang | |
| 7,190,284 B1 | 3/2007 | Dye | |
| 7,230,986 B2 | 6/2007 | Wise | |
| 7,356,083 B2 | 4/2008 | Herath | |
| 2003/0128140 A1 | 7/2003 | Xie | |
| 2004/0190635 A1 | 9/2004 | Ruehle | |
| 2005/0135433 A1 | 6/2005 | Chang | |
| 2005/0162531 A1 | 7/2005 | Hsu | |
| 2007/0016406 A1 | 1/2007 | Thumpudi | |
| 2007/0174588 A1 | 7/2007 | Fuin | |
| 2007/0297501 A1 | 12/2007 | Hussain | |

* cited by examiner

*Primary Examiner*—Peguy JeanPierre
(74) *Attorney, Agent, or Firm*—Park, Vaughan & Fleming LLP

(57) ABSTRACT

The described embodiments include a system for performing data compression. The system includes a compression mechanism with N channels, and an internal decompression mechanism in the compression mechanism that accepts N channels of fixed-length packets. The compression mechanism is configured to receive an input bit stream that includes a set of data words. In response to receiving a request from the internal decompression mechanism identifying at least one of the channels for which a fixed-length packet is to be appended to the output stream, the system fills a fixed-length packet for the identified channel with compressed data words; appends the fixed-length packet to the output stream; and forwards a copy of the fixed-length packet to the internal decompression mechanism. The internal decompression mechanism decompresses fixed-length packets for each of the channels to determine a next fixed-length packet to be appended to the output stream.

21 Claims, 11 Drawing Sheets

METHOD AND APPARATUS FOR COMPRESSING AND DECOMPRESSING DATA

RELATED APPLICATIONS

This application is a continuation-in-part application of, and hereby claims priority under 35 U.S.C. §120 to, pending U.S. patent application Ser. No. 12/241,785, filed 30 Sep. 2008, entitled "Method and Apparatus for Compressing and Decompressing Data," by inventor Jeffry E. Gonion.

BACKGROUND

1. Field of the Invention

The described embodiments relate to data processing systems. More specifically, the described embodiments relate to techniques for compressing and decompressing data.

2. Related Art

Many modern electronic devices can operate on large amounts of data (i.e., data files or data streams from a network). For example, these electronic devices can operate on multimedia files such as digital video files, document files such as scanned text documents, simulation files, and other types of files. Because large files can consume significant amounts of memory, and transferring large files across a network can consume considerable amounts of network bandwidth, compression techniques have been developed to reduce the size of the data files. Some compression techniques involve compressing the data using "lossless" compression techniques. Lossless compression techniques remove redundant information from the data in a manner that does not compromise the integrity of the data, thereby allowing for bit-accurate reconstruction of the original data from the compressed data.

Some lossless compression systems replace fixed-length words with shorter variable-length codes when compressing data files. In such systems, shorter codes can be assigned to words that are used more frequently, and longer codes can be assigned to words that appear less frequently. For example, some lossless compression systems use Huffman coding, context-adaptive variable length coding (CAVLC), or context-adaptive binary arithmetic coding (CABAC) to compress data files. Lossless compression typically produces a dense bit stream of variable-length compressed data words. Because maximal compression is the primary goal, designers have given little consideration to the processing required to decompress the data. Thus, existing systems are forced to decompress data serially, which is time-consuming.

Hence, what is needed is a method for compressing and decompressing data without the above-described problem.

SUMMARY

The described embodiments include a system for performing data compression (e.g., computer system 100 in FIG. 1). The system includes a compression mechanism with N channels, and an internal decompression mechanism in the compression mechanism that accepts N channels of fixed-length packets. The compression mechanism is configured to receive an input bit stream that includes a set of data words for compression and placement into fixed-length packets for corresponding channels. In response to receiving a request from the internal decompression mechanism identifying at least one of the channels for which a fixed-length packet is to be appended to the output stream, the compression mechanism is configured to: fill a fixed-length packet for the identified channel with compressed data words; append the fixed-length packet to the output stream; and forward a copy of the fixed-length packet to the internal decompression mechanism.

In some embodiments, when filling the fixed-length packet for the identified channel, until the fixed-length packet is full, the compression mechanism is configured to iteratively: (1) retrieve data words from the input bit stream; (2) compress each of the retrieved data words into a variable-length word; and (3) append the variable-length words in a round-robin pattern into a fixed-length packet for each of the channels.

In some embodiments, when appending the variable-length words in a round-robin pattern into a fixed-length packet for each channel, the compression mechanism is configured to store the variable-length words in a fixed-length packet for each channel until a fixed-length packet for the channel is full, and then store subsequent variable-length words into a buffer associated with the channel.

In some embodiments, when filling a fixed-length packet for a channel, if variable-length words are available in the buffer associated with the channel, the compression mechanism is configured so that if sufficient variable-length words are available in the buffer to fill a fixed-length packet for the channel, the compression mechanism fills the fixed-length packet with the available variable-length words from the buffer, appends the full fixed-length packet to an output stream of fixed-length packets, and forwards a copy of the filled fixed-length packet to the internal decompression mechanism. Otherwise, the compression mechanism uses the variable-length words in the buffer to partially fill the fixed-length packet, and then performs the retrieving, compressing, and storing operations to fill a remainder of the fixed-length packet.

In some embodiments, the internal decompression mechanism is configured to receive the fixed-length packet for the identified channel from the compression mechanism. The internal decompression mechanism is further configured to proceed with the internal decompression operation by retrieving a variable-length word from a fixed-length packet for each channel in a round-robin pattern and decompressing the variable-length word for that channel. Upon decompressing a last word in a fixed-length packet for a channel, the internal decompression mechanism is configured to send a request to the compression mechanism to cause the compression mechanism to output a fixed-length packet for the channel.

In some embodiments, at startup, the internal decompression mechanism is configured to send requests to the compression mechanism indicating that a fixed-length packet is needed to continue decompression for each of the channels.

In some embodiments, the compression mechanism is configured to store the output stream in a computer-readable storage device or output the output stream to a network. In these embodiments, a separate remote decompression mechanism subsequently retrieves the output stream from the computer-readable storage medium or receives the output stream from the network and decompresses the output stream to recreate the input bit stream.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the system is not limited to the embodiments shown, but is to be accorded the widest scope consistent with the principles and features disclosed herein.

Figure 1:
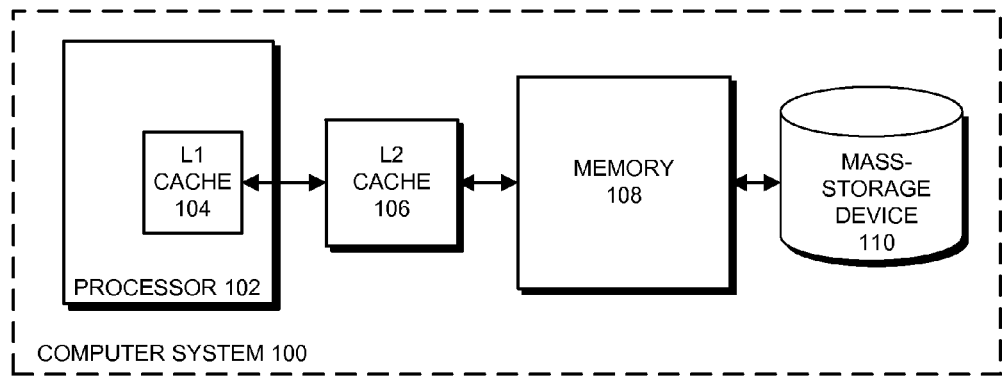
FIG. 1 presents a block diagram of a computer system in accordance with the described embodiments.

The data structures and code described in this detailed description are typically stored on a computer-readable storage device, which may be any device or medium that can store code and/or data for use by a computer system (e.g., computer system 100 in FIG. 1). The computer-readable storage devices can include, but are not limited to, volatile memory, non-volatile memory, magnetic and optical storage devices such as disk drives, magnetic tape, CDs (compact discs), DVDs (digital versatile discs or digital video discs), flash memories, or other media capable of storing code and/or data for use by a computer system now known or later developed. (Note that non-statutory media such as "transmission signals" are not included in the computer-readable storage devices in these embodiments.)

Furthermore, the methods and processes described below can be embodied in hardware modules. For example, the hardware modules can include, but are not limited to, microprocessors, application-specific integrated circuit (ASIC) chips, field-programmable gate arrays (FPGAs), and/or other programmable-logic devices now known or later developed. For example, in some embodiments, the hardware modules include a microprocessor such as processor 102 (see FIG. 1). When the hardware modules are activated, the hardware modules perform the methods and processes embodied within the hardware modules.

Data Compression

The described embodiments facilitate efficient data compression and/or decompression. Generally, compressing data involves reducing the size of files that contain the data, thereby enabling the files to be stored in less memory, be processed more efficiently, and consume less bandwidth while being transferred in a network. Conversely, decompressing data involves restoring the data from a compressed data file.

One approach to compressing data involves first applying a lossy compression technique to "raw" (uncompressed) data. The output of the lossy compression technique (i.e., "lossy stream") is subsequently compressed using a lossless compression technique. In some cases, the lossy stream includes a finite set of values, many of which are repeated throughout the stream. For example, data in the lossy stream may be stored in 16-bit words, wherein some 16-bit words are repeated more frequently than others. Lossless compression techniques typically work by mapping variable-length encodings to corresponding fixed-length words. Fixed-length words that appear frequently in the lossy stream are assigned shorter length encodings, whereas fixed-length words that appear less frequently are assigned longer encodings. For example, a frequently used 16-bit fixed-length word may be reduced to a 2- or 3-bit variable-length word. The variable-length words are then stored sequentially, typically without padding, which facilitates storing more variable-length words in the same space than was previously used to store the corresponding fixed-length words.

Compressing data using lossless compression typically involves first performing a statistical analysis of the data to determine how frequently each fixed-length word appears in the stream. The metrics collected from the statistical analysis are then used to create a dictionary of mappings that assign variable-length encodings to fixed-length words. The different types of statistical analysis are known in the art and hence are not described in further detail. In the following description, we assume that statistical analysis has already taken place and that mappings of variable-length mappings to fixed-length words have already been established.

Generally, the described embodiments may use any lossless compression technique that assigns variable-length encodings to compress data. For example, some embodiments compress data using entropy coding, such as Huffman coding, context-adaptive variable-length coding (CAVLC), and context-adaptive binary arithmetic coding (CABAC), while other embodiments compress data using arithmetic coding. Lossless compression techniques are known in the art and are therefore not discussed in further detail.

Video Data Compression and/or Decompression

Some embodiments compress and decompress video data. In some embodiments the video data is first compressed using a lossy compression technique. The result of the lossy compression may be a stream of commands (i.e., operands) that are executed during playback to reconstruct a video image. For example, some lossy compression techniques generate commands that contain transformations or relational operations which describe scene changes between video frames. Such lossy compression techniques achieve file-size reductions by only maintaining information about scene changes between frames, rather than maintaining full frame data. (Note that these techniques are referred to as "lossy" because the reconstructed video includes less video information than the original raw video data.)

The output of the lossy compression technique typically includes a fixed set of commands, many of which are repeated throughout the stream. Commands are typically fixed bit length, e.g., 16-bit or 32-bit words. To further reduce the size of the video data, some embodiments apply lossless compression techniques to the stream of commands in the lossy stream.

Computer System

FIG. 1 presents a block diagram of a computer system 100 in accordance with the described embodiments. Computer system 100 includes processor 102, L2 cache 106, memory 108, and mass-storage device 110, wherein processor 102 includes L1 cache 104.

Processor 102 can be a general-purpose processor that performs computational operations. For example, processor 102 can be a central processing unit (CPU) such as a microprocessor, a controller, an application-specific integrated circuit (ASIC), or a field-programmable gate array (FPGA).

Mass-storage device 110, memory 108, L2 cache 106, and L1 cache 104 are computer-readable storage devices that collectively form a memory hierarchy that stores data and instructions for processor 102. Generally, mass-storage device 110 is a high-capacity, non-volatile memory, such as a disk drive or a large flash memory, with a large access time, while L1 cache 104, L2 cache 106, and memory 108 are smaller, faster semiconductor memories that store copies of frequently used data. Memory 108 is typically a dynamic random access memory (DRAM) structure that is larger than L1 cache 104 and L2 cache 106, whereas L1 cache 104 and L2 cache 106 are typically comprised of smaller static random access memories (SRAM). In some embodiments, L2 cache 106, memory 108, and mass-storage device 110 are shared between one or more processors in computer system 100. Such memory structures are well-known in the art and are therefore not described in more detail.

Computer system 100 can be incorporated into many different types of electronic devices. For example, computer system 100 can be part of a desktop computer, a laptop computer, a server, a media player, an appliance, a cellular phone, a piece of testing equipment, a network appliance, a personal digital assistant (PDA), a hybrid device (i.e., a "smart phone") or another electronic device.

Although we use specific components to describe computer system 100, in alternative embodiments different components may be present in computer system 100. For example, computer system 100 may not include some of the memory hierarchy (e.g., memory 108 and/or mass-storage device 110). Alternatively, computer system 100 may include video cards, video-capture devices, user-interface devices, network cards, optical drives, and/or other peripheral devices that are coupled to processor 102 using a bus, a network, or another suitable communication channel. Computer system 100 may also include one or more additional processors, wherein the processors share some or all of L2 cache 106, memory 108, and mass-storage device 110.

Devices for Compression and Decompression

Figure 2A:
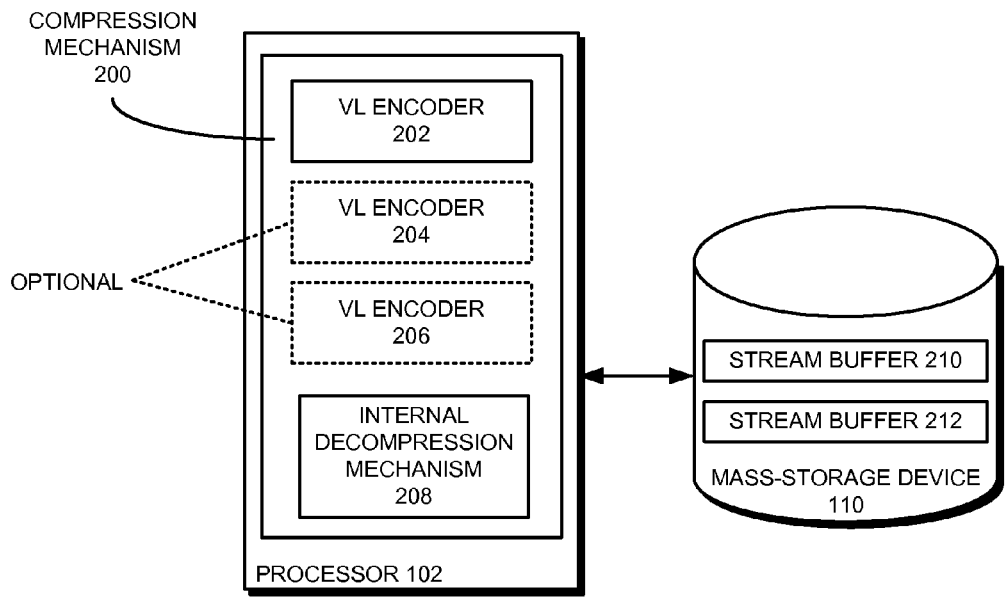
FIG. 2A presents a block diagram illustrating a processor configured to compress data in accordance with the described embodiments.

FIG. 2A presents a block diagram illustrating a processor 102 configured to compress data in accordance with the described embodiments. Processor 102 includes a compression mechanism 200, which includes variable-length encoder (VL encoder) 202 and internal decompression mechanism 208, and may include any number of additional VL encoders, such as optional VL encoders 204-206. Mass-storage device 110 includes stream buffers 210-212 where an input and an output stream are respectively stored. (Note that although we use processor 102 to describe particular embodiments, other embodiments use different types of integrated circuits, such as FPGAs or ASICs.)

Stream buffers 210-212 are illustratively stored on mass-storage device 110. In some embodiments, stream buffers 210-212 are stored in other types of volatile and/or non-volatile memory, whether fixed or removable, such as a cache, RAM, flash, CD-ROM, or DVD disks. In other embodiments stream buffers 210-212 are streamed across a network, such as a data stream received from or transmitted to the Internet, a LAN, or a wireless network (e.g., a cellular network, a home wireless network, etc.).

VL encoder 202 and optional VL encoders 204-206 are encoders that are used by compression mechanism 200 for compressing fixed-length data words from an input bit stream into variable-length words. Compression mechanism 200 adds the variable-length words to fixed-length packets for corresponding channels and appends the fixed-length packets to an output stream (in an order controlled by internal compression mechanism 208, as described below). More specifically, compression mechanism 200 generates fixed-length packets for an I-th channel that contain variable-length words that are compressed from data words in every I-th location of the input bit stream. Note that compression mechanism 200 includes buffers or other memory circuits (see, e.g., FIG. 4A) for each channel that store the fixed-length packets as they are being filled.

An external decompression mechanism (e.g., parallel processing mechanism 300 in FIG. 3) subsequently receives fixed-length packets from the output stream (or retrieves the fixed-length packets from a storage device that holds a copy of the output stream) and decompresses the fixed-length packets to regenerate the input bit stream. The external decompression mechanism can include two or more parallel decompression mechanisms, each of which is used to decompress fixed-length packets for a corresponding channel. Thus, a packet that is placed in a given channel during compression is decompressed using a decompression mechanism associated with the channel.

In the described embodiments, internal decompression mechanism 208 controls the order in which compression mechanism 200 appends the fixed-length packets to the output stream to ensure that the fixed-length packets are placed in the output stream in the order in which the external decompression mechanism subsequently retrieves the fixed-length packets for decompression. More specifically, internal decompression mechanism 208 requests fixed-length packets for the channels from compression mechanism 200, decompresses the fixed-length packets, and then requests subsequent fixed-length packets for channels that require additional compressed data. By locally decompressing the packets, internal decompression mechanism 208 can emulate the eventual order of decompression in the external decompression mechanism and use the determined order of buffers draining (i.e., fixed-length packets being decompressed) to request placement of fixed-length packets in the output stream.

During operation, upon receiving a request for a fixed-length packet for a given channel from internal decompression mechanism 208, compression mechanism 200 appends a fixed-length packet for the channel to the output stream. When appending the fixed-length packet to the output stream, compression mechanism 200 can retrieve and compress sufficient fixed-length words from the input stream to ensure the fixed-length packet for the requested channel is full before it is appended. Alternatively, if compression mechanism 200 has variable-length words available in a channel buffer for the channel (channel buffers are described in more detail below), compression mechanism 200 can use the variable-length words to partially or fill a fixed-length packet for the channel. Compression mechanism 200 can then can append the full fixed-length packet to the output stream, or finish filling the partially filled fixed-length packet and append the then-filled packet to the output stream. In addition to appending the fixed-length packet to the output stream, compression mechanism 200 forwards the filled fixed-length packet to internal decompression mechanism 208. Internal decompression mechanism 208 decompresses the forwarded fixed-length packet along with decompressing fixed-length packets for the other channels. Upon determining that insufficient data remains in a fixed-length packet for one of the channels to continue decompressing variable-length words for the channel (i.e., if the fixed-length packet is empty or contains only a partial variable-length word), internal decompression mechanism 208 requests the next fixed-length packet for that channel from compression mechanism 200.

In these embodiments compression mechanism 200 does not automatically append the fixed-length packets to the output stream as soon as they are filled. Instead, compression mechanism 200 awaits a request from internal decompression mechanism 208 for a packet for a given channel before appending the filled fixed-length packet to the output stream. In some embodiments, compression mechanism 200 also does not fill a fixed-length packet for a given channel until receiving a request from internal decompression mechanism 208 for a packet for the channel.

As described above, when filling a fixed-length packet, compression mechanism 200 retrieves fixed-length data words from the input bit stream in sequence, compresses the fixed-length data words into variable-length words, and stores them in a round-robin pattern into fixed-length packets for corresponding channels. Because a round-robin pattern is used for filling the fixed-length packets, when retrieving and compressing fixed-length words to fill a fixed-length packet for a given channel, compression mechanism 200 also retrieves and compresses fixed-length words for the other channels. In other words, while filling a requested fixed-length packet, compression mechanism 200 also adds variable-length words to fixed-length packets for the other channels.

Because each of the fixed-length packets can include a different number of variable-length words, the fixed-length packets for the other channels may be filled before the fixed-length packet for the requested channel is filled. Thus, while filling a fixed-length packet for a given channel, sufficient variable-length words may be compressed for the other channels to "overflow" the fixed-length packet for those channels. Some embodiments include a buffer for each channel for storing variable-length words that overflow from a fixed-length packet for the channel (not shown).

In some embodiments, the buffer for each channel is a first-in-first-out (FIFO) buffer, and a separate memory location is used for storing the fixed-length packet for each channel as the fixed-length packet is filled. In these embodiments, the overflowing variable-length words for a given channel are stored in the associated buffer. The variable-length words in a channel's associated buffer can be retrieved in order to fill subsequent fixed-length packet(s) for the channel. If there are insufficient variable-length words in the channel buffer to fill a packet for the channel, compression mechanism 200 uses the variable-length words in the overflow buffer as the initial variable-length words in the fixed-length packet, and then continues to retrieve and compress fixed-length words from the input bit stream until the remainder of the fixed-length packet is full.

In some embodiments, the buffer used to store fixed-length packets includes a number of segments that are the size of a fixed-length packet. In these embodiments, compression mechanism 200 completely fills a current fixed-length packet in a given segment (i.e., until variable-length words begin overflowing from the fixed-length packet) and then proceeds to fill the subsequent packet in the next segment in the buffer in a round-robin pattern. In these embodiments, in response to a request for a fixed-length packet for a given channel from internal decompression mechanism 208, if compression mechanism 200 has a full fixed-length packet for the channel, compression mechanism 200 sends the next filled fixed-length packet. However, if a partially filled fixed-length packet is present in the buffer, compression mechanism 200 fills the remainder of the fixed-length packet and then sends the filled fixed-length packet. Note that in some cases the buffer may hold more than one filled fixed-length packet for a given channel. In this case, compression mechanism 200 sends the least recently filled fixed-length packet.

In some embodiments, until a requested fixed-length packet is full, the compression mechanism 200 is configured to retrieve a set of fixed-length data words from the input bit stream, compress each of the retrieved data words in the set into a variable-length word, and append the variable-length words in a round-robin pattern into a fixed-length packet for each of the channels. The retrieved set of data words can include any number of data words (including just one data word). In these embodiments, if the set of data words is larger than the number of channels, compression mechanism 200 may retrieve multiple data words for each channel. For example, assuming an embodiment where compression mechanism 200 includes three channels, if the retrieved set of data words includes 18 words, compression mechanism 200 retrieves six data words to be compressed for each channel. As described above, every I-th of the retrieved words is compressed and then appended to a fixed-length packet for an I-th channel in a round-robin pattern. Hence, because there are three channels in this example, every third word is compressed and appended to a fixed-length packet for a corresponding channel. For example, the variable-length words generated by compressing fixed-length words 1, 4, 7, 10, 13, and 16 from the input bit stream are appended to the fixed-length packet for the first channel, while the remaining variable-length words are appended to fixed-length packets for the second and third channels in the round-robin pattern.

In embodiments where the set of retrieved data words is larger than the number of channels, the fixed-length packet for the requested channel may also overflow. In the same way as with the overflowed variable-length words for the other channels, in some embodiments, compression mechanism 200 stores the overflowed words for the requested channel in a channel buffer associated with the channel. In alternative embodiments, compression mechanism 200 stores the overflowed variable-length words in a buffer associated with the channel so that the overflowed variable-length words can be used to fill subsequent fixed-length packets for the channel.

In addition, in some embodiments, the remaining space in a fixed-length packet for a given channel can be too small to fit the next variable-length word that has been compressed for the channel. However, in these embodiments the fixed-length packet is of a predetermined size (i.e., includes a predetermined number of bits). Thus, in some embodiments, compression mechanism 200 can store a partial variable-length word in a given fixed-length packet to fill up the remainder of the packet. The remaining portion of the variable-length word can be stored in the channel buffer for the channel and used as the initial partial variable-length word for the next packet to be filled for the channel. For example, see VL part 450 in FIG. 4B and VL part 451 in FIG. 4C. In some embodiments, the partial variable-length word can be stored in a channel buffer for the channel.

Figure 2B:
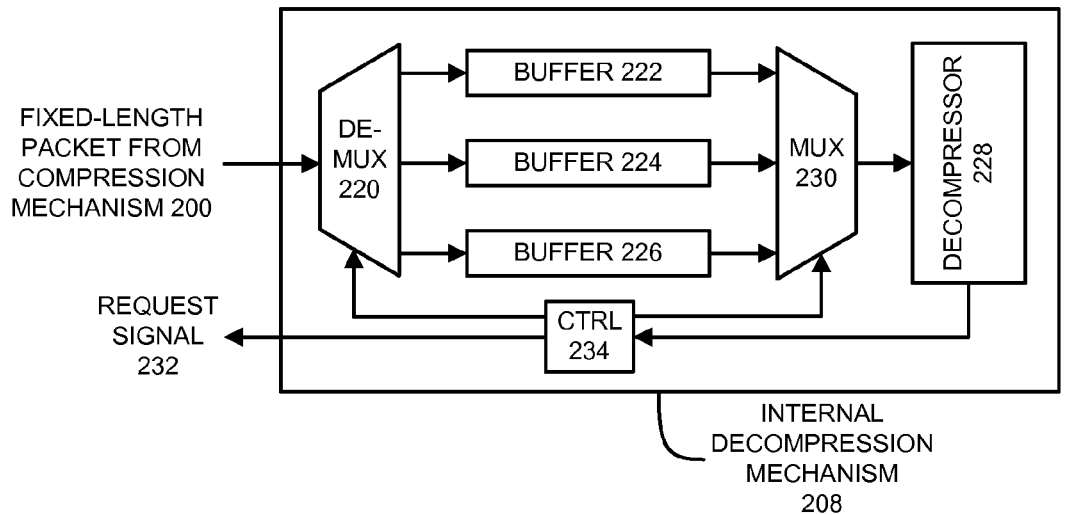
FIG. 2B presents an expanded view of an internal decompression mechanism in accordance with the described embodiments.

FIG. 2B presents an expanded view of internal decompression mechanism 208 in accordance with the described embodiments. As shown in FIG. 2B, internal decompression mechanism 208 includes multiplexer (MUX) 230, demultiplexer (DEMUX) 220, buffers 222-226, decompressor 228, and control (CTRL) 234. Buffers 222-224 (interchangeably called "channel buffers") are circuits that store fixed-length packets for channels 1-3, respectively, which have been forwarded from compression mechanism 200 for decompression by decompressor 228. For example, buffers 222-226 can be registers, memory elements, or other circuits for storing fixed-length packets. Decompressor 228 is a circuit that decompresses variable-length words retrieved from fixed-length packets in the channel buffers. Control 234 is a circuit that serves as an interface for, and controls the operation of, internal decompression mechanism 208.

During decompression of fixed-length packets from the channel buffers, control 234 asserts a select signal for MUX 230 to enable decompressor 228 to retrieve variable-length words for decompression from fixed-length packets in the channel buffers in a round-robin pattern. For example, in some embodiments, the sequence in which variable-length words are retrieved from the fixed-length packets in the channel buffers is: buffer 222, buffer 224, buffer 226, buffer 222, buffer 224, etc.

Upon determining that insufficient data remains in a fixed-length packet in one of the channel buffers to continue decompressing variable-length words for the channel (i.e., if the fixed-length packet in the channel buffer is empty or contains only a partial variable-length word), control 234 asserts request signal 232 to request the next fixed-length packet for the corresponding channel from compression mechanism 200. Compression mechanism 200 then fills a fixed-length packet for the channel and forwards the filled fixed-length packet to internal decompression mechanism 208 (or simply forwards an already filled fixed-length packet, if one is available). In addition, compression mechanism 200 appends the fixed-length packet to the output stream. Control 234 asserts a select signal for DEMUX 220 to ensure that the fixed-length packet received from compression mechanism 200 in response to the request is stored in the proper channel buffer.

In some embodiments, internal decompression mechanism 208 discards the decompressed variable-length words (i.e., discards the fixed-length words that are decompressed from the variable-length words).

Note that we present internal decompression mechanism 208 with particular functional blocks. However, in alternative embodiments, internal decompression mechanism 208 may have different functional blocks. For example, internal decompression mechanism 208 may include two or more decompressors 228, or may include more or fewer channel buffers. Moreover, control 234 may be included in decompressor 228.

Although for the purposes of illustration we present processor 102 as including the mechanisms shown in FIG. 2A, in some embodiments, processor 102 is a microprocessor or another such device that includes general-purpose circuits that can be configured to perform data compression. For example, processor 102 can be a microprocessor that executes instructions that configure general-purpose circuits in one or more pipelines in the processor to perform the operations performed by compression mechanism 200, while the stream buffer is stored in and retrieved from an L1 cache 104 and/or memory 108.

Furthermore, the described embodiments may be implemented using multiple threads or processes executing in parallel on multiple processors in a multiprocessor system, or multiple cores in a multi-core system, or any combination thereof. Some embodiments may be implemented as a single thread executing on a single processor to benefit from improved code scheduling. Moreover, compression mechanism 200 can be included on an ASIC, an FPGA, or another integrated circuit.

Furthermore, the described embodiments may be implemented using vector software where each channel is processed in a separate vector element.

Starting Compression of a New Input Bit Stream

When compression mechanism 200 starts compressing fixed-length words from a new input bit stream, all of internal decompression mechanism 208's channel buffers are initially empty. Hence, internal decompression mechanism 208 must retrieve a first fixed-length packet for each channel buffer, which occurs as follows.

As described above, internal decompression mechanism 208 uses a round-robin pattern when decompressing fixed-length packets. Although different starting positions can be used, in some embodiments internal decompression mechanism 208 starts with the buffer for channel 1 (i.e., buffer 222 in FIG. 2B). However, because compression has just started, upon attempting to decompress a variable-length word from a fixed-length packet from buffer 222, decompressor 228 determines that the buffer is empty. Control 234 then signals compression mechanism 200 to send a fixed-length packet for the corresponding channel (e.g., channel 1 for buffer 222). In response, compression mechanism 200 fills a fixed-length packet for the channel and forwards the fixed-length packet to internal decompression mechanism 208 or simply forwards an already filled fixed-length packet, if one is available (along with appending the fixed-length packet to the output stream). Upon receiving the requested fixed-length packet from compression mechanism 200, internal decompression mechanism 208 stores the fixed-length packet in buffer 222. Decompressor 228 then retrieves a variable-length word from the fixed-length packet in buffer 222 and decompresses the variable-length word into a fixed-length word. After these operations, buffer 222 contains a fixed-length packet, but buffers 224 and 226 are still empty.

Next, decompressor 228 proceeds to buffer 224 to decode a variable-length word from a fixed-length packet in that buffer. As with buffer 222, decompressor 228 discovers that buffer 224 is empty. Control 234 therefore signals compression mechanism 200 to send the next fixed-length packet for the corresponding channel (e.g., channel 2 for buffer 224). In response, compression mechanism 200 fills a fixed-length packet for the channel and forwards the fixed-length packet to internal decompression mechanism 208 (along with appending the fixed-length packet to the output stream). Upon receiving the requested fixed-length packet from compression mechanism 200, internal decompression mechanism 208 stores the fixed-length packet in buffer 224. Decompressor 228 then retrieves a variable-length word from the fixed-length packet in buffer 224 and decompresses the variable-length word into a fixed-length word. After these operations, buffers 222 and 224 contain fixed-length packets, but buffer 226 is still empty.

Internal decompression mechanism 208 proceeds to each channel buffer in this way until a fixed-length packet has been requested for each of the channel buffers. Internal decompression mechanism 208 then continues decompressing fixed-length packets as described above.

Note that although we describe an embodiment where compression mechanism 200 initially sits idle and awaits a request from internal decompression mechanism 208 before filling a packet for a requested channel, in alternative embodiments, at startup, compression mechanism 200 can retrieve and compress fixed-length words until fixed-length packets are filled for one or more of the channels. For example, assuming the embodiment shown in FIGS. 2A-2B, compression mechanism 200 can initially fill a fixed-length packet for channel 1, or for channels 1-3, etc. In some of these embodiments, compression mechanism 200 fills fixed-length packets for all of the channels until a fixed-length packet for each channel is full, at which point compression mechanism 200 stops and awaits a subsequent request for a packet from a given channel from internal decompression mechanism 208 before proceeding.

Decompression Mechanism

Figure 3:
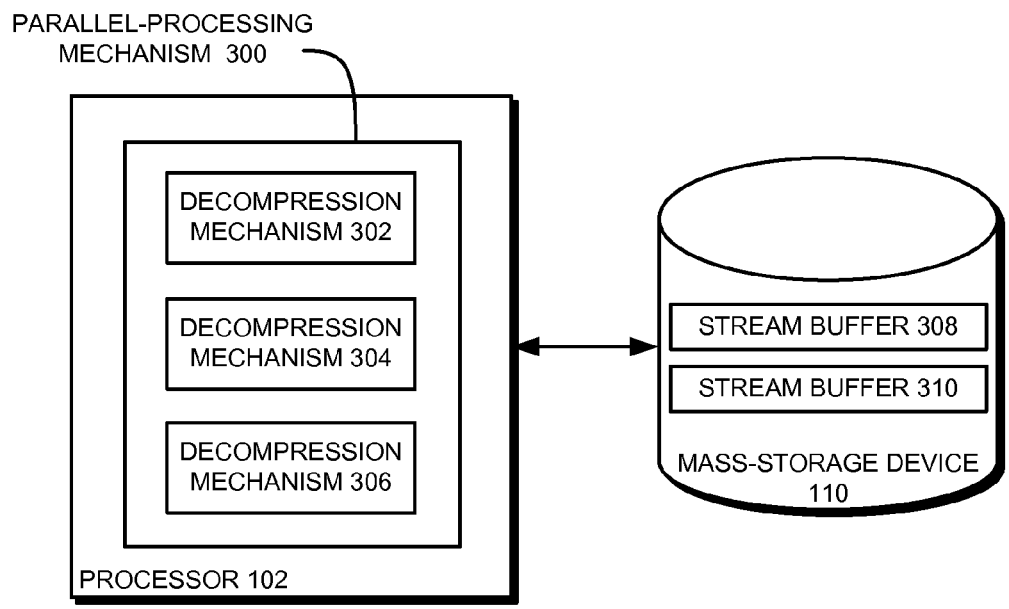
FIG. 3 presents a block diagram illustrating a processor configured to decompress data in accordance with the described embodiments.

FIG. 3 presents a block diagram illustrating a processor 102 configured to decompress data in accordance with the described embodiments. Processor 102 includes a parallel-processing mechanism 300, which includes decompression mechanisms 302-306. Mass-storage device 110 includes stream buffers 308-310, where an input and an output stream are respectively stored. (Note that the input stream for parallel processing mechanism 300 is originally generated as an output stream by compression mechanism 200.)

During operation, decompression mechanisms 302-306 each retrieve a fixed-length packet from the input stream. Then, decompression mechanisms 302-306 retrieve and decompress a set of variable-length words from the fixed-length packet. Next, each decompression mechanism 302-306 assembles the decompressed variable-length words into every N-th position of an output stream. Note that although three decompression mechanisms 302-306 are shown, parallel-processing mechanism 300 may include any number of decompression mechanisms.

As described above, decompression mechanisms 302-306 decompress fixed-length packets for corresponding channels from the input stream in parallel. Moreover, the input stream has been arranged by compression mechanism 200 using internal decompression mechanism 208 so that decompression mechanisms 302-306 retrieve packets for decompression for a given channel in the order that it requires them.

Stream buffers 308-310 are illustratively stored on mass-storage device 110. In some embodiments, stream buffers 308-310 are stored in other types of volatile and/or non-volatile memory, whether fixed or removable, such as a cache, RAM, flash, CD-ROM, or DVD disks. In other embodiments, stream buffers 308-310 are streamed across a network, such as a data stream received from or transmitted to the Internet, a LAN, or a wireless network (e.g., a cellular network, a home wireless network, etc.).

Although for the purposes of illustration we present processor 102 as including the mechanisms shown in FIG. 3, in some embodiments, processor 102 is a microprocessor or another such device that includes general-purpose circuits that can be configured to perform data decompression. For example, processor 102 can be a microprocessor that executes instructions that configure general-purpose circuits in one or more pipelines in the processor to perform the operations performed by parallel-processing mechanism 300, while the stream buffer is stored in and retrieved from an L1 cache 104 and/or memory 108.

Furthermore, the described embodiments may be implemented using multiple threads or processes executing in parallel on multiple processors in a multiprocessor system, or multiple cores in a multi-core system, or any combination thereof. Some embodiments may be implemented as a single thread executing on a single processor to benefit from improved code scheduling.

For illustrative purposes, the term "retrieve" is used in this description to describe an operation during which a complete variable-length word becomes available for decompression in a decompression mechanism (e.g., decompression mechanisms 302-306). However, when variable-length words are stored in sequence without padding, boundaries between variable-length words may not be known until the variable-length words are decoded. In other words, the beginning of a variable-length word can be determined only after the preceding variable-length word is decompressed. Thus, in the described embodiments, the final bits in a given fixed-length packet may include a first portion of the bits from a variable-length word, while the remaining portion of the bits of the variable-length word are stored in the next fixed-length packet in the channel (i.e., variable-length words may "span" fixed-length packets).

In these embodiments, during operation, decompression mechanism 302 (or 304-306) can retrieve a fixed-length packet which contains a portion of a variable-length word (along with zero or more complete variable-length words). When decompression mechanism 302 extracts the variable-length words from the packet, any bits remaining from a variable-length word that spans packets are preserved and are combined with bits from the next packet to form the next complete variable-length word. Therefore, after "retrieving a variable-length word" a complete variable-length word is available for decompression at a decompression mechanism.

Compressing Data Using the Compression Mechanism

FIGS. 4A-4D present block diagrams illustrating a process for compressing data in accordance with the described embodiments. Specifically, FIGS. 4A-4D present a sequence of operations performed by compression mechanism 200 when compressing data words received from input stream 400. In this example, we describe compression mechanism 200 at a time when compression mechanism 200 has already compressed a number of fixed-length words from the input bit stream. More specifically, we first describe compression mechanism 200 in the process of fulfilling a request from internal decompression mechanism 208 for fixed-length packet from channel 2, and then fulfilling a request from internal decompression mechanism 208 for a fixed-length packet from channel 1.

Input stream 400 is stream of fixed-length data words which is illustratively stored in stream buffer 210. Input stream 400 includes fixed-length data words 410-415, but may include any number of data words. In some embodiments, the data words are produced by compressing data using a lossy compression technique. In contrast, output stream 460, which is illustratively stored in stream buffer 212, contains packets assembled by compression mechanism 200.

During operation, variable-length encoder 202 receives a fixed-length data word from input stream 400 and compresses the fixed-length data word to produce a variable-length (VL) data word. Variable-length words are then stored in round-robin fashion in fixed-length packets 401-403 (interchangeably called "packets" 401-403), corresponding to channels 1-3, respectively, as described below.

Note that for illustrative purposes, packets 401-403 contain some existing variable-length words (i.e., compression mechanism 200 is in the process of filling a fixed-length packet in response to a request from internal decompression mechanism 208). Packets 401-403 may be stored in volatile memory, such as memory 108 or L1 cache 104, or non-volatile memory, such as mass-storage device 110. Additionally, packets 401-403 may be stored in a variety of hardware and/or software data structures, such as a first-in-first-out (FIFO) buffer, ring buffer, dynamically or statically allocated arrays, or linked-lists.

Figure 4A:
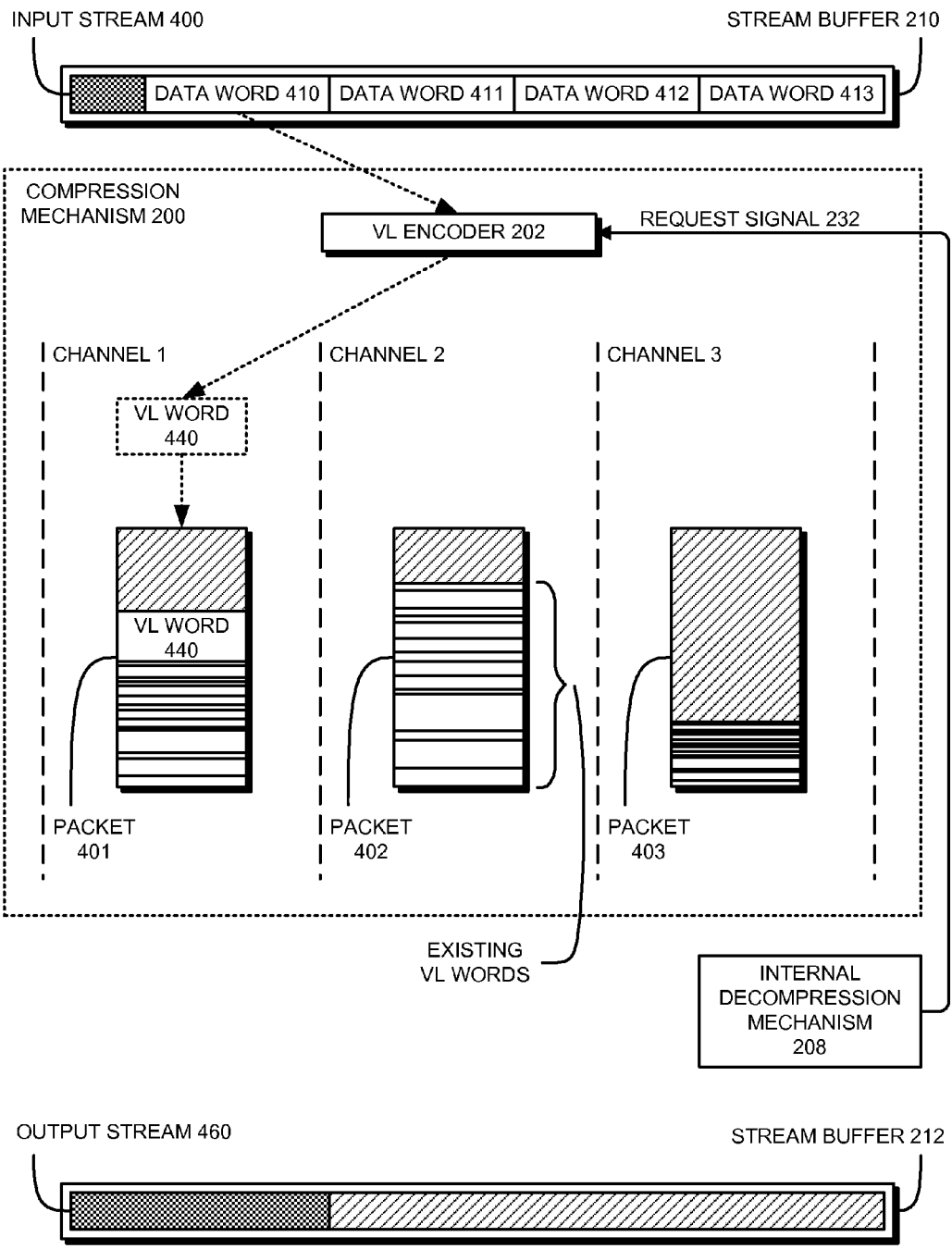
FIGS. 4A-4E present block diagrams illustrating data compression in accordance with the described embodiments.

For illustrative purposes, packets fill from bottom to top. In FIG. 4A and throughout the figures, a cross-hatch pattern is used to illustrate empty (unused) portions of a packet or stream, while a darker checkerboard pattern is used to illustrate portions of a stream that contain data.

FIG. 4A presents compression mechanism 200 at a time when internal decompression mechanism 208 has already determined that the channel buffer for channel 2 (e.g., buffer 224) had insufficient data in a fixed-length packet to enable continuing decompressing variable-length words for the channel (i.e., the fixed-length packet in the buffer was empty or contained only a partial variable-length word), and has requested a fixed-length packet for channel 2 from compression mechanism 200. Compression mechanism 200 has therefore started to fill fixed-length packet 402. Because compression mechanism 200 fills packets 401-403 in a round-robin pattern, each of the packets contains a number of variable-length words. As shown in FIG. 4A, we present compression mechanism 200 as a next variable-length word is being compressed for channel 1 (i.e., for packet 401) in the round-robin pattern.

Note that in FIG. 4A, compression mechanism 200 has already started the compression process for input stream 400. Hence, compression mechanism 200 has previously compressed one or more fixed-length packets and appended the fixed-length packets to the output stream in response to a request from internal decompression mechanism 208 (as is shown by the checkerboard pattern in output stream 460).

As described above, when filling a fixed-length packet for a given channel, one or more variable-length words may overflow the packets for the other channels and be used as initial variable-length words for the next fixed-length word(s) for the other channels. Packets 401-403 in FIG. 4A are illustrated with different numbers of variable-length words to show the effect of starting with a packet that contains one or more variable-length words that were overflow from filling an earlier packet.

While filling packet 401, VL encoder 202 retrieves fixed-length data word 410 from input stream 400. VL encoder 202 then compresses data word 410 to produce variable-length word ("VL word") 440. Next, VL encoder 202 stores VL word 440 into packet 401.

Figure 4B:
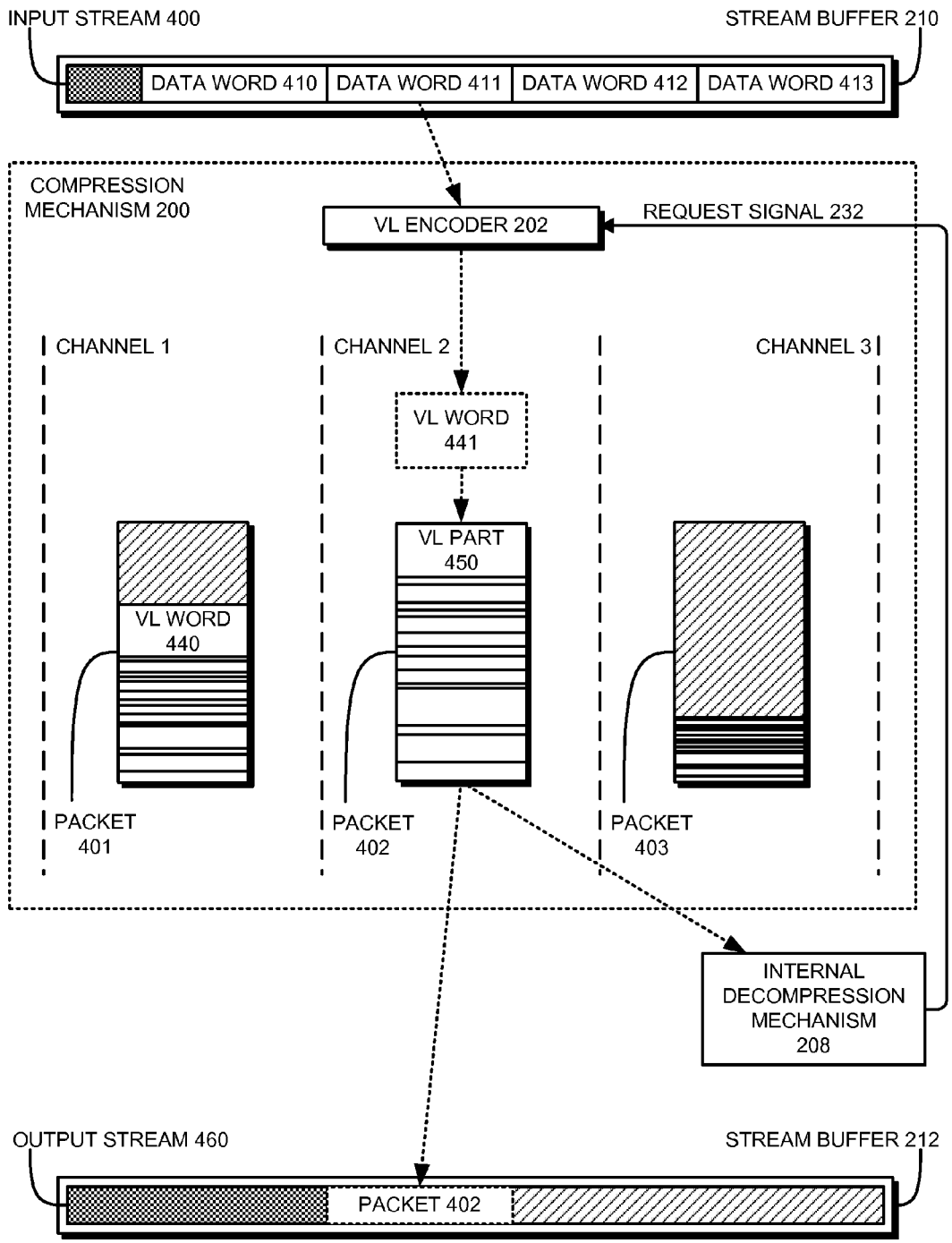

FIG. 4B shows how the next data word from input stream 400 is compressed. VL encoder 202 receives the second data word 411 and compresses the data word to produce VL word 441. Before storing VL word 441 into packet 402, VL encoder 202 determines there is insufficient free space in packet 402 to store VL word 441. Then, VL encoder 202 splits VL word 441 into two parts, VL part 450, which is as long as the amount of free space in packet 402, and VL part 451 (not shown). Next, VL encoder 202 stores VL part 450 into packet 402. Next, because packet 402 becomes full, VL encoder 202 appends the packet into output stream 460 and forwards the packet to internal decompression mechanism 208 (as shown by the arrows from packet 402 to stream buffer 212 and internal decompression mechanism 208). As described above, internal decompression mechanism 208 receives the packet, places the packet in the corresponding channel buffer (i.e., buffer 224), and continues to decompress variable-length words one at a time from the channel buffers in the round-robin pattern.

Figure 4C:
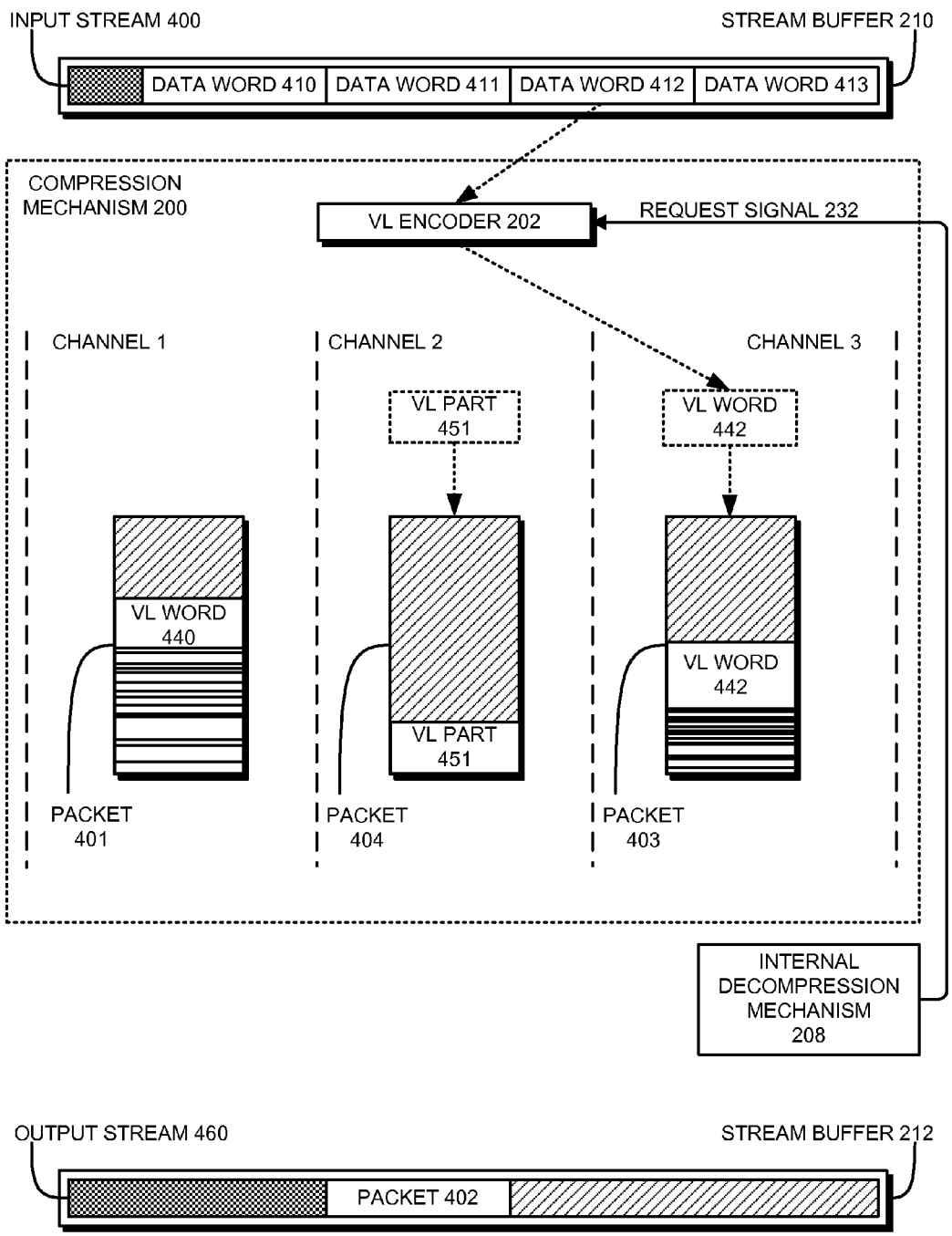

Referring now to FIG. 4C, when packet 402 becomes full and is sent to stream buffer 212 and internal decompression mechanism 208, a new packet, packet 404, becomes the current packet for the second channel. As described above, compression mechanism 200 can begin filling a new fixed-length packet in the separate memory location (i.e., in the memory location used for assembling a packet for the corresponding channel). Alternatively, packet 404 can be held in the next segment of the buffer that originally held packet 402, and compression mechanism 200 can start using the next segment as the current packet for the channel. Before storing subsequent VL words into packet 404, VL encoder 202 first stores VL part 451 into packet 404. Next, VL encoder 202 receives the third data word 412 from input stream 400. Then, VL encoder 202 compresses data word 412 to produce VL word 442 and stores VL word 442 into packet 403.

For the purposes of illustration, we assume that while decompressing fixed-length packets received from compression mechanism 200, internal decompression mechanism 208 next determines that the channel buffer for channel 1 has insufficient data in a fixed-length packet to enable continuing decompressing variable-length words for the channel (i.e., the fixed-length packet in the buffer is empty or contained only a partial variable-length word). Internal decompression mechanism 208 then sends a request to compression mechanism 200 for the next fixed-length word for channel 1.

Note that as shown in FIGS. 4A-4C, the next fixed-length packet for channel 1, packet 401, already contains a number of variable-length words that were added to packet 401 while packet 402 was being filled for channel 2 (and possibly as previous packets were being filled for channels 2 and/or 3). Thus, compression mechanism 200 has nearly filled packet 401 when the request is received from internal decompression mechanism 208 for a packet for channel 1.

Figure 4D:
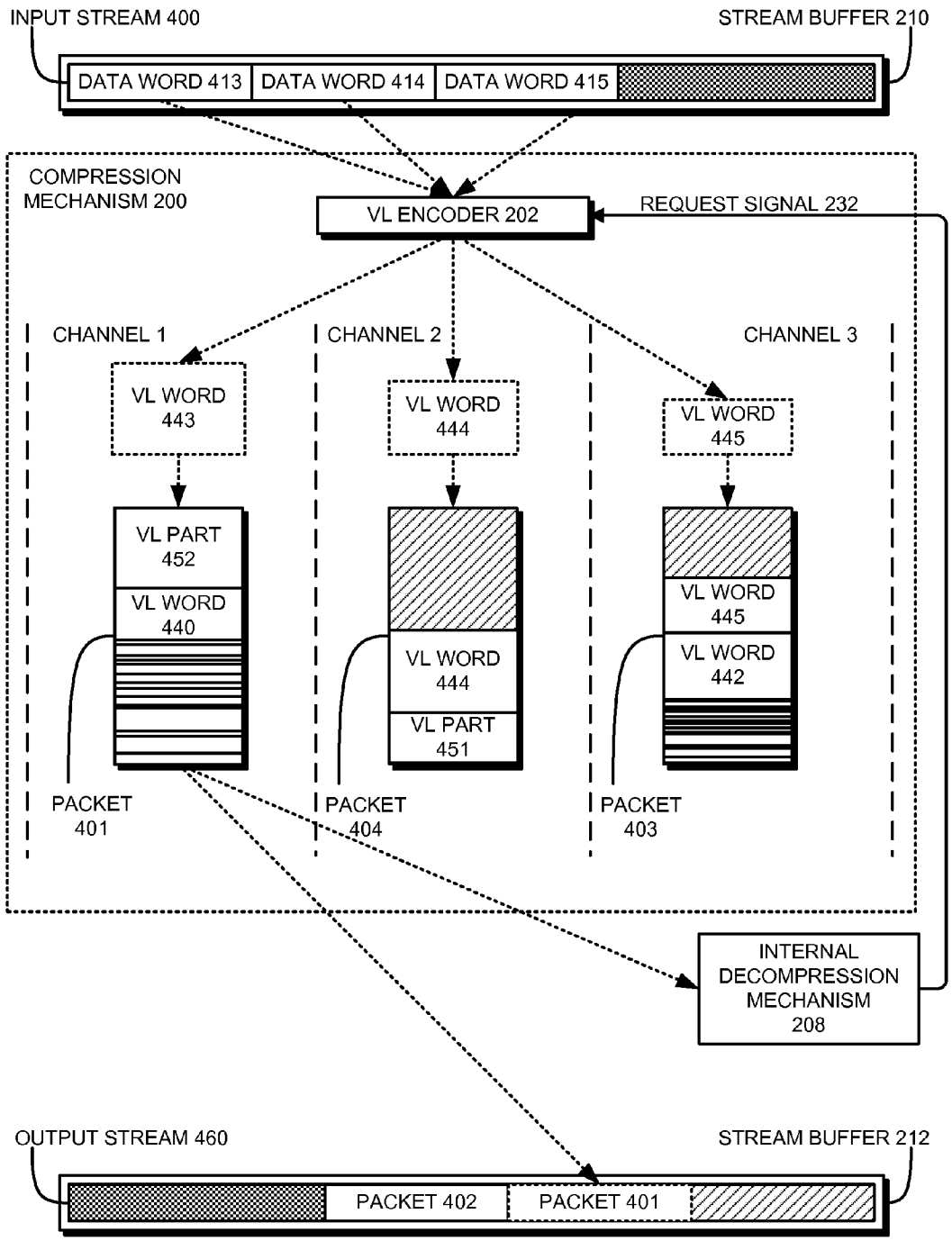

Referring now to FIG. 4D, compression and storage of data words 413-415 from input stream 400 is shown (i.e., the compression of multiple words, which actually occurs in sequence in the described embodiments, is illustrated in FIG. 4D). VL encoder 202 receives data word 413 and compresses the data word to produce VL word 443. Before storing VL word 443 into packet 401, VL encoder 202 determines there is insufficient free space in packet 401 to store VL word 443. Thus, as described earlier with reference to FIG. 4B, VL encoder 202 stores into packet 401 VL part 452, which is the portion of VL word 443 that is as long as the amount of free space in packet 401. Next, because packet 401 is full, VL encoder 202 assembles packet 401 into output stream 460 by appending packet 401 to packet 402 and forwards the packet to internal decompression mechanism 208 (as shown by the arrows from packet 401 to stream buffer 212 and internal decompression mechanism 208). Internal decompression mechanism 208 receives the packet, places the packet in the corresponding channel buffer (i.e., buffer 222), and continues to decompress variable-length words one at a time from the channel buffers in the round-robin pattern.

Continuing with FIG. 4D, VL encoder 202 receives data word 414 and compresses the data word to produce VL word 444. Note that packet 404 contains VL part 451, which was stored by VL encoder 202 as described earlier with reference to FIG. 4B. Next, VL encoder 202 stores VL word 444 into packet 404. Then, VL encoder 202 receives data word 415, compresses the data word to produce VL word 445, and stores VL word 445 into packet 403. As can be seen in FIGS. 4A-4D, VL encoder 202 stores variable-length words to packets in "round-robin" fashion.

The system illustrated in FIGS. 4A-4D includes three channels and a single VL encoder which compresses data words sequentially. Other embodiments may use two or more VL encoders to speed up processing. In some embodiments, the number of encoders is equal to the number of channels, and data can be fetched from input stream 400 in sets of N data words at a time. Variable-length encoders can then each compress a data word from the set in parallel.

Figure 4E:
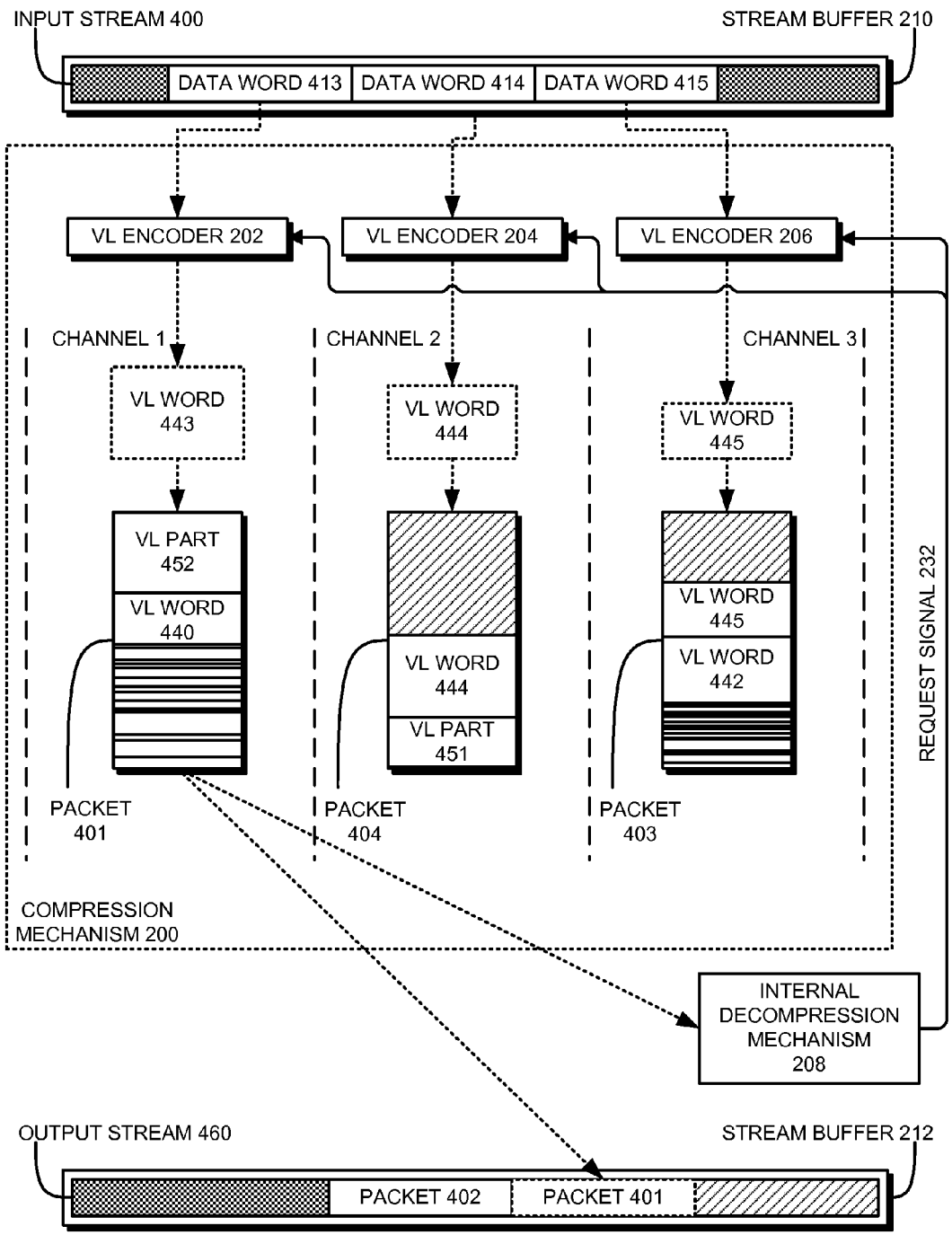

For example, FIG. 4E presents a block diagram of a system that includes three VL encoders for compressing data in parallel in accordance with the described embodiments. For the purpose of illustration, we assume that internal decompression mechanism 208 previously sent a request to compression mechanism 200 for a fixed-length packet for channel 1 (i.e., packet 401).

In this embodiment, data words are fetched from input stream 400 in sets of three, because three data words can be compressed in parallel. (For illustrative purposes the same data words are compressed in FIG. 4E as in FIG. 4D). Note that like the previously described embodiments, in these embodiments, the fixed-length words are retrieved in a round-robin pattern according to channel. However, unlike the previously described embodiments, the fixed-length words are compressed in parallel. The words are retrieved and then compressed in parallel until the fixed-length packet for the requested channel is filled and sent to output stream 460 and internal decompression mechanism 208. Compression mechanism 200 then awaits the next request for a fixed-length packet from internal decompression mechanism 208 before retrieving and compressing subsequent fixed-length words.

During operation, VL encoders 202-206 receive a first set of data words 413-415. Next, VL encoders 202-206 compress one word each into variable-length words 443-445. VL encoders 202-206 store VL words 444-445 into packets 404 and 403, which are the packets for channels 2 and 3, respectively. As described earlier with reference to FIG. 4D, VL encoder 202 stores VL part 452 into packet 401, which is the packet for channel 1. Packet 401 becomes full, so VL encoder 202 appends packet 401 to output stream 460, as described earlier with reference to FIG. 4D. Compression mechanism 200 also forwards the packet to internal decompression mechanism 208 (as shown by the arrows from packet 401 to internal decompression mechanism 208). Internal decompression mechanism 208 receives the packet, places the packet in the corresponding channel buffer (i.e., buffer 222), and continues to decompress variable-length words one at a time from the channel buffers in the round-robin pattern.

Although three channels are shown in FIGS. 4A-4E, it would be apparent to one skilled in the art to generalize the illustrated embodiments to any number N channels. In embodiments of compression mechanism 200 that include N channels, compression mechanism 200 receives a set of N data words from input stream 400, compresses the data words into a set of N variable-length words, and stores an I-th variable-length word from the set of N data words into a fixed-length packet for the I-th channel, where $0 < I \leq N$. Then, compression mechanism 200 assembles each fixed-length packet into output stream 460 when the packet becomes full.

The described embodiments compress data in a manner that removes serialized dependencies when decompressing the data. In other words, by distributing variable-length words across several packets, the described embodiments facilitate parallelizing the decompression process, because variable-length words in the packets can be decompressed in parallel. Although decoding a variable-length word still depends on decoding the variable-length word that preceded the variable-length word within the packet, there are no serialized dependencies between a set of N words across N packets, which facilitates a set of N words to be decompressed in parallel. The process of decompressing data in this manner is described in more detail in the decompression section.

Decompressing Data Using the Parallel-Processing Mechanism

Figure 5A:
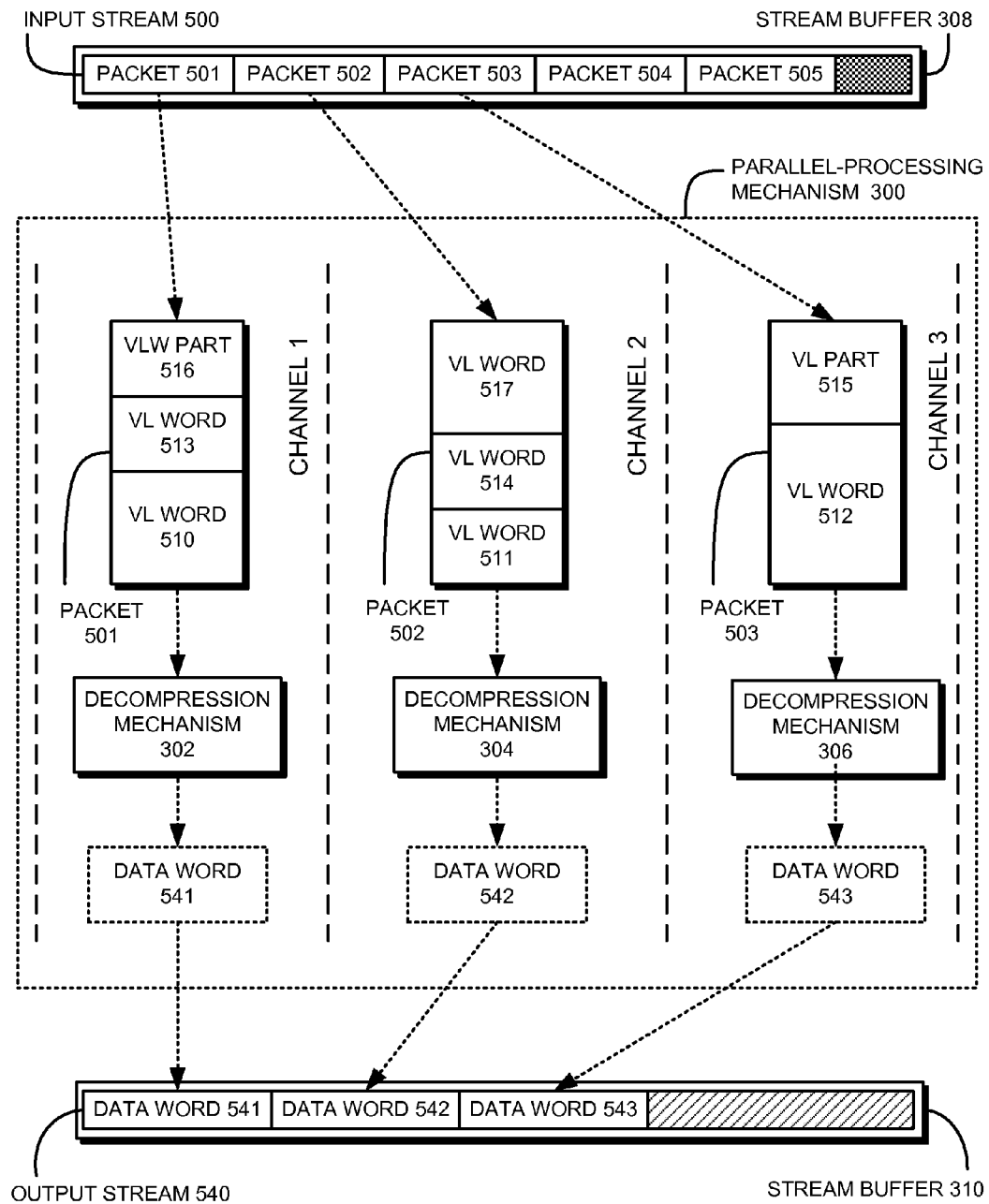
FIGS. 5A-5B present block diagrams illustrating data decompression in accordance with the described embodiments.
Figure 5B:
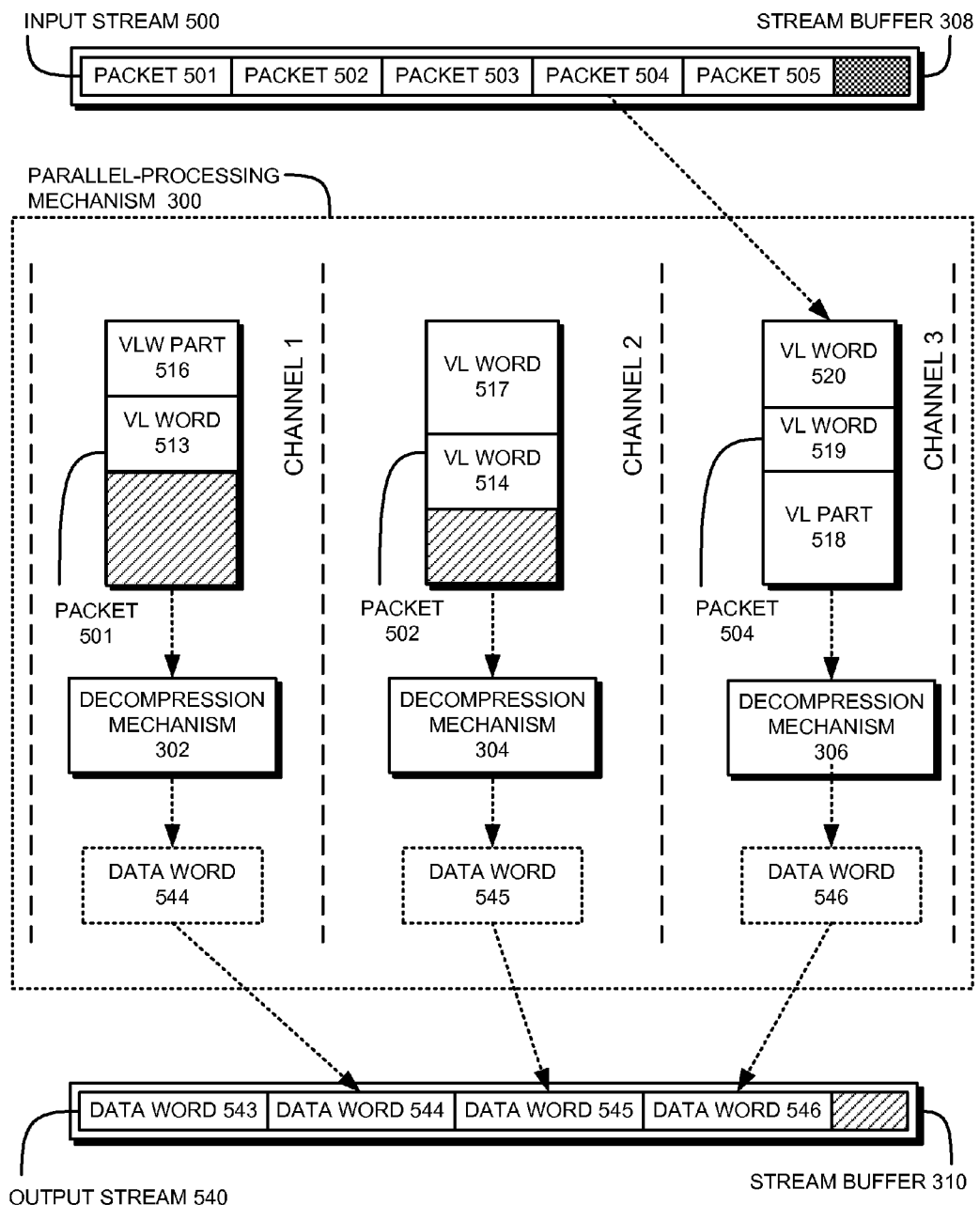

FIGS. 5A-5B present block diagrams illustrating a process for decompressing data in accordance with the described embodiments. Specifically, FIGS. 5A-5B present a sequence of operations performed by parallel-processing mechanism 300 when decompressing packets from input stream 500.

Input stream 500, which is illustratively stored in stream buffer 308, comprises three channels (N=3) and contains packets assembled by a compression mechanism 200 in accordance with the described embodiments. Output stream 540 is illustratively stored in stream buffer 310.

During operation, decompression mechanisms 302-306 retrieve a fixed-length packet 501-503 from a corresponding channel 1-3 in input stream 500. Then, decompression mechanisms 302-306 retrieve a set of VL words 510-512 from packets 501-503, respectively, and decompress the set of VL words into data words 541-543. Decompression mechanisms 302-306 operate in parallel to decompress a variable-length word independently from each other.

In addition, decompression mechanisms 302-306 each decompress one variable-length word from a given fixed-length packet in the same amount of time (e.g., during a clock cycle, a predetermined number of clock cycles, or another period). For clarity and brevity, we assume that the decompression mechanisms can decompress one variable-length word per clock cycle.

Because fixed-length packets may contain different numbers of variable-length words, and the decompression mechanisms decompress variable-length words at the same rate, the decompression mechanisms may complete decompression of fixed-length packets for the different channels at different times. For example, assuming that decompression mechanisms 302-306 are decompressing packets 501-503, decompression mechanism 306 (for channel 3) finishes decompressing packet 503 a cycle before decompression mechanisms 302-304 finish decompressing packets 501 and 502. (Note that this example assumes that decompression mechanism 306 uses a cycle to determine that the partial packet is present in packet 503; alternative embodiments may finish earlier.)

As described above, internal decompression mechanism 208 in compression mechanism 200 locally decompresses the fixed-length packets to determine an order for placing fixed-length packets into an output stream. The ordering is such that parallel-processing mechanism 300 can freely retrieve fixed-length packets from input stream 500 (which was originally output from compression mechanism 200) as packets are required for each channel. In these embodiments, parallel-processing mechanism 300 does not determine which channel each fixed-length packet should be decompressed in, but instead simply retrieves a next fixed-length packet from input stream 500 as a fixed-length packet is required for a given channel.

When finished decompressing the variable-length words, the decompression mechanisms append the decompressed variable-length words to the output stream in a round-robin pattern. Specifically, decompression mechanisms 302-306 store fixed-length data words 541-543 into the illustrated positions of the output stream.

Referring to FIG. 5B, in the next iteration, decompression mechanisms 302-306 retrieve VL words 513-514, decompress them to data words 544-545 respectively, and store data words 544-545 into a second position of output stream 540. Note that in FIG. 5A, packet 503, which was the packet for channel 3, contained one complete VL word 512, which was decompressed as described earlier with reference to FIG. 5A. The remainder of packet 503 contained VL part 515 (shown in FIG. 5A), which is part of a VL word that spans two packets. In order to decompress the next full VL word, decompression mechanism 306 first retrieves from input stream 500 fixed-length packet 504, which contains VL part 518. Then, decompression mechanism 306 combines VL part 515 with VL part 518 and decompresses the combined VL word into data word 546. Next, decompression mechanism 306 stores data word 546 into the second position of output stream 540. (Note that although we describe the operations performed by decompression mechanisms 302-306 separately, these operations are performed in parallel within parallel-processing mechanism 300.)

For illustrative purposes input stream 500 comprises three channels (N=3), and parallel-processing mechanism 300 comprises a corresponding channel for each channel in input stream 500. In other embodiments, input stream 500 may comprise any number of channels N. For an input stream that comprises N channels, the described embodiments achieve a decompression speed-up that is proportional to the number of channels. For example, a decompression task parallelized with N channels can decompress data in approximately 1/N of the time it takes to decompress the same data serially.

Process for Compressing Data

Figure 6:
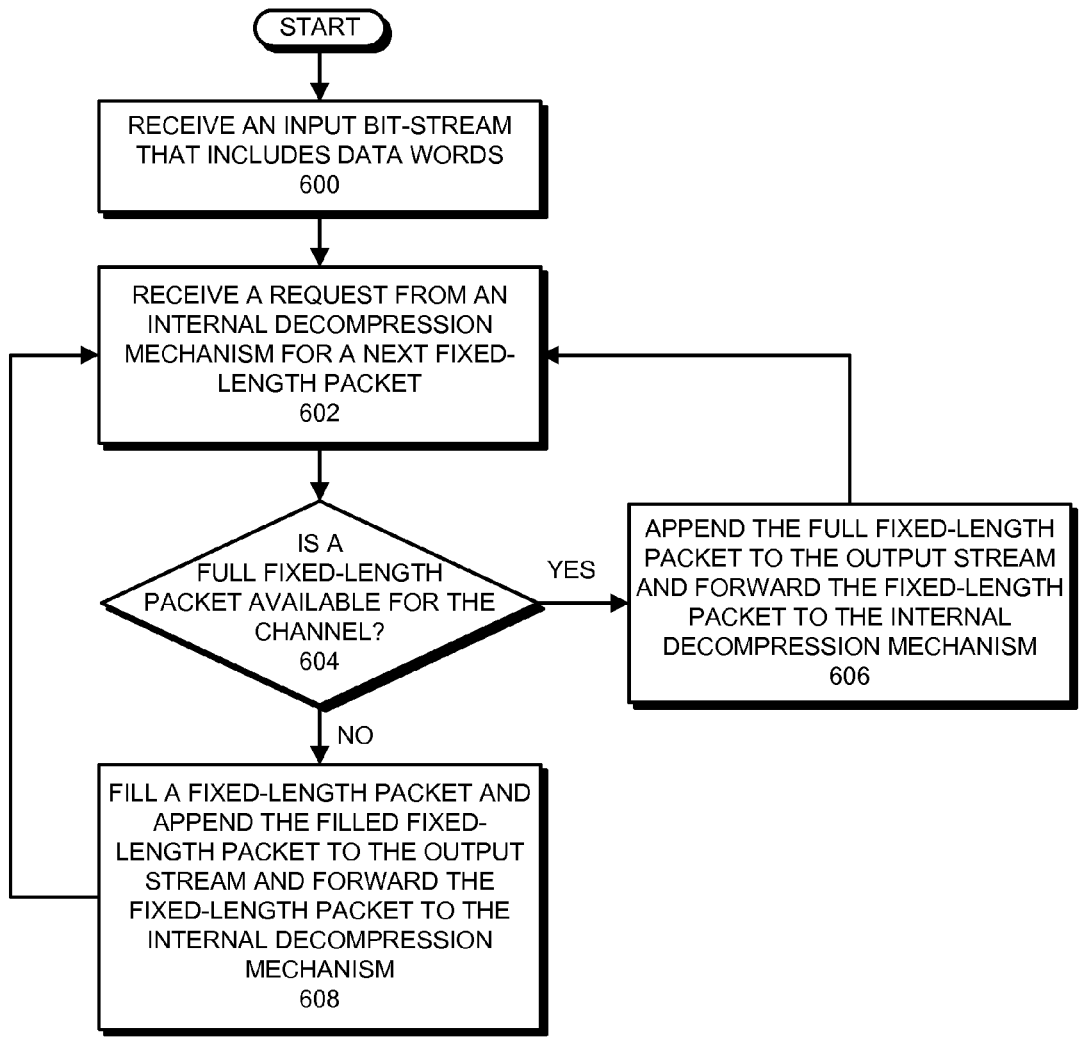
FIG. 6 presents a flowchart illustrating a process for compressing data in accordance with the described embodiments.

FIG. 6 presents a flowchart illustrating a process for compressing data in accordance with the described embodiments. The process starts when compression mechanism 200 receives an input bit stream that includes a set of data words (step 600). As described above, in some embodiments, the data words are fixed-length data words output from previous lossy compression of original source data (e.g., video, audio, file, etc.), although in alternative embodiments, other types of input bit streams can be used. The input bit stream can be received directly, such as streaming data received using a network connection, or can be a stored copy of an input bit stream retrieved from a computer-readable storage medium. The received data words are to be compressed and placed in fixed-length words for a set of corresponding channels.

Compression mechanism 200 then receives a request from internal decompression mechanism 208 for a next fixed-length packet (step 602). Although compression mechanism 200 receives the input bit stream, compression mechanism 200 does not immediately begin appending fixed-length packets filled with compressed variable length-words to the output stream. Instead, compression mechanism 200 awaits a request from internal decompression mechanism 208 before appending the next fixed-length packet to the output stream.

Upon receiving a request for a next fixed-length packet for a given channel, compression mechanism 200 determines if a full fixed-length packet is available for the channel (step 604). Recall that when filling a fixed-length packet for a given channel, because compression mechanism 200 retrieves and compresses fixed-length words from the input bit stream in a round-robin pattern, compression mechanism 200 can also add variable-length words to fixed-length packets for the other channels. Hence, compression mechanism 200 can fill fixed-length packets for the other channels while filling a fixed-length packet requested for a given channel. In step 606, the described embodiments determine if compression mechanism 200 has a fixed-length packet for the requested channel that was filled in this way. If compression mechanism 200 has a full fixed-length packet for the channel, compression mechanism 200 appends the full fixed-length packet to output stream 460 and forwards the fixed-length packet to the internal decompression mechanism 208 in response to the request (step 606). Compression mechanism 200 then returns to step 602 to await a next request from internal decompression mechanism 208 for a packet for a channel.

Otherwise, if no fixed-length packet is available for the channel, or if a partially filled fixed-length packet is available for the channel, compression mechanism 200 fills a fixed-length packet and appends the fixed-length packet to output stream 460 and forwards the fixed-length packet to the internal decompression mechanism 208 in response to the request (step 608). Compression mechanism 200 then returns to step 602 to await a next request from internal decompression mechanism 208 for a packet for a channel.

Process for Decompressing Data

Figure 7:
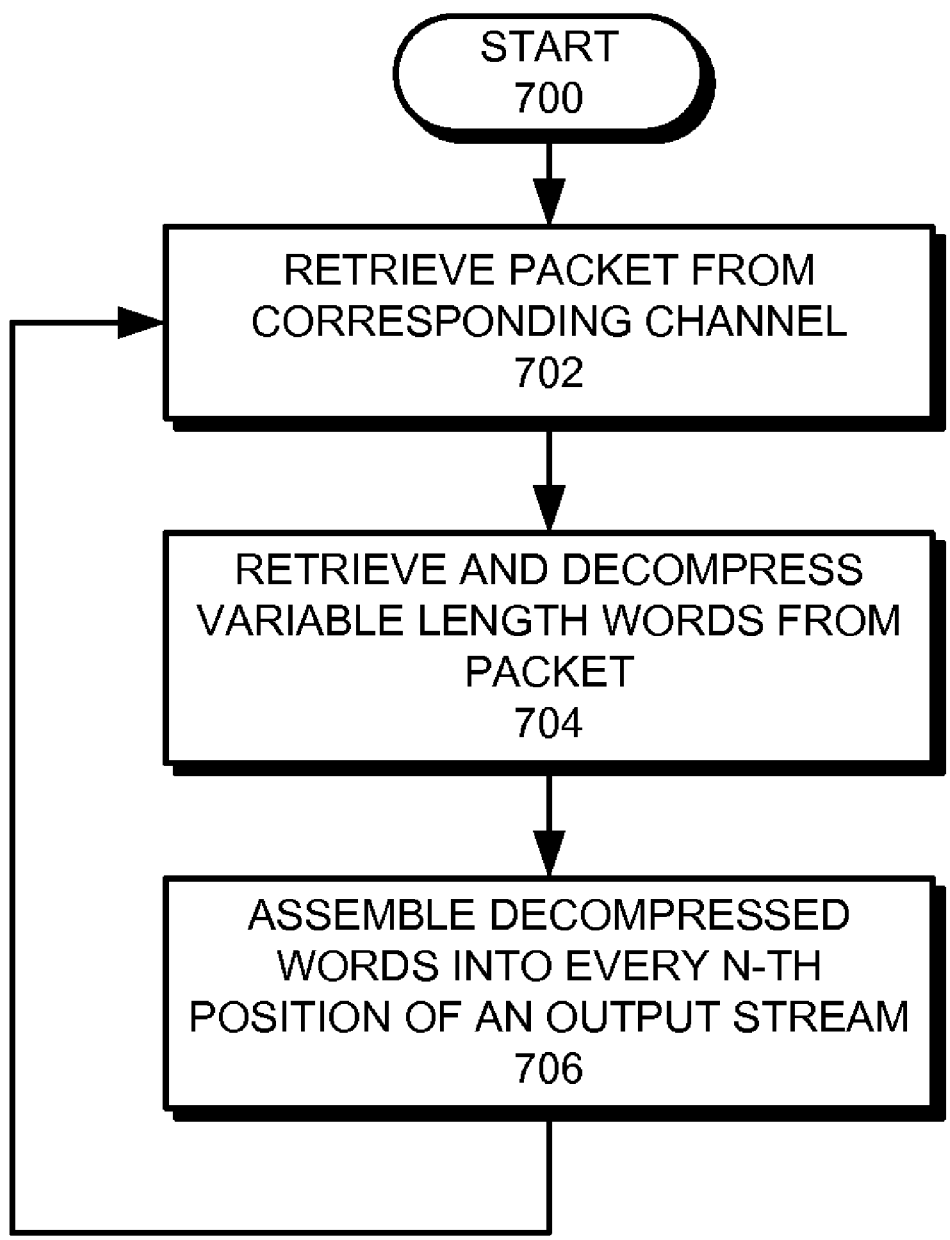
FIG. 7 presents a flowchart illustrating a process for decompressing data in accordance with the described embodiments.

FIG. 7 presents a flowchart illustrating a process for decompressing data in accordance with the described embodiments. The embodiment shown in FIG. 7 includes N channels.

The process for decompressing data starts when each decompression mechanism retrieves a fixed-length packet from a corresponding channel in an input stream that includes N channels (step 702). Then, each decompression mechanism retrieves and decompresses a set of variable-length words from the fixed-length packet (step 704). Next, each decompression mechanism assembles the decompressed variable-length words into every N-th position of an output stream (step 706).

Note that each decompression mechanism may finish decompressing a variable-length word separately and at different times from other decompression mechanisms. However, the process of assembling the decompressed variable-length words serializes the variable-length words so they are stored in the output bit stream in the same order as the order in which they were compressed.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the potential embodiments. The scope of the embodiments is defined by the appended claims.

What is claimed is:

1. An apparatus for performing data compression, comprising:
 a compression mechanism including N channels; and
 an internal decompression mechanism in the compression mechanism,
 wherein the internal decompression mechanism accepts N channels of fixed-length packets;
 wherein the compression mechanism is configured to:
  receive an input bit stream including a set of data words; and
  in response to receiving a request from the internal decompression mechanism identifying at least one of the channels for which a fixed-length packet is to be appended to the output stream:
   fill a fixed-length packet for the identified channel with compressed data words;
   append the fixed-length packet to the output stream; and
   forward a copy of the fixed-length packet to the internal decompression mechanism.

2. The apparatus of claim 1, wherein when filling the fixed-length packet with compressed data words, until the fixed-length packet is full, the compression mechanism is configured to iteratively:
 retrieve data words from the input bit stream;
 compress each of the retrieved data words into a variable-length word; and
 append the variable-length words in a round-robin pattern into a fixed-length packet for each of the channels.

3. The apparatus of claim 2, wherein when appending the variable-length words in the round-robin pattern into a fixed-length packet for each channel, the compression mechanism is configured to:

store the variable-length words in a fixed-length packet for each channel until a fixed-length packet for the channel is full, then store subsequent variable-length words into a buffer associated with the channel.

4. The apparatus of claim 3, wherein when filling a fixed-length packet for a channel, if variable-length words are available in the buffer associated with the channel, the compression mechanism is configured so that:

if sufficient variable-length words are available in the buffer to fill a fixed-length packet for the channel, the compression mechanism fills the fixed-length packet with the available variable-length words from the buffer, appends the full fixed-length packet to an output stream of fixed-length packets, and forwards a copy of the filled fixed-length packet to the internal decompression mechanism;

otherwise, the compression mechanism uses the variable-length words in the buffer to partially fill the fixed-length packet, and then performs the retrieving, compressing, and storing operations to fill a remainder of the fixed-length packet.

5. The apparatus of claim 1, wherein the internal decompression mechanism is configured to:

receive the fixed-length packet for the identified channel from the compression mechanism; and in a round-robin pattern, for each channel,
retrieve a variable-length word from a fixed-length packet;
decompress the variable-length word; and
upon determining that there is insufficient data in a fixed-length packet to enable decompressing variable-length words for the channel, send a request to the compression mechanism to cause the compression mechanism to output a fixed-length packet for the channel.

6. The apparatus of claim 1, wherein upon starting compressing a new input bit stream, the internal decompression mechanism is further configured to send requests to the compression mechanism indicating that a fixed-length packet is needed to continue decompression for each of the channels.

7. The apparatus of claim 1, wherein the compression mechanism is further configured to store the output stream in a computer-readable storage device or output the output stream to a network;

wherein a separate remote decompression mechanism subsequently retrieves the output stream from the computer-readable storage device or receives the output stream from the network and decompresses the output stream to recreate the input bit stream.

8. A computer system for performing data compression, comprising:

a processor;
a memory coupled to the processor, wherein the memory stores instructions and data for the processor;
a compression mechanism in the processor, wherein the compression mechanism includes N channels; and
an internal decompression mechanism in the compression mechanism, wherein the internal decompression mechanism accepts N channels of fixed-length packets;
wherein the compression mechanism is configured to:
receive an input bit stream including a set of data words; and
in response to receiving a request from the internal decompression mechanism identifying at least one of the channels for which a fixed-length packet is to be appended to the output stream:

fill a fixed-length packet for the identified channel with compressed data words;
append the fixed-length packet to the output stream; and
forward a copy of the fixed-length packet to the internal decompression mechanism.

9. The computer system of claim 8, wherein when filling the fixed-length packet with compressed data words, until the fixed-length packet is full, the compression mechanism is configured to iteratively:

retrieve data words from the input bit stream;
compress each of the retrieved data words into a variable-length word; and
append the variable-length words in a round-robin pattern into a fixed-length packet for each of the channels.

10. The computer system of claim 9, wherein when appending the variable-length words in the round-robin pattern into a fixed-length packet for each channel, the compression mechanism is configured to:

store the variable-length words in a fixed-length packet for each channel until a fixed-length packet for the channel is full, then store subsequent variable-length words into a buffer associated with the channel.

11. The computer system of claim 10, wherein when filling a fixed-length packet for a channel, if variable-length words are available in the buffer associated with the channel, the compression mechanism is configured so that:

if sufficient variable-length words are available in the buffer to fill a fixed-length packet for the channel, the compression mechanism fills the fixed-length packet with the available variable-length words from the buffer, appends the full fixed-length packet to an output stream of fixed-length packets, and forwards a copy of the filled fixed-length packet to the internal decompression mechanism;

otherwise, the compression mechanism uses the variable-length words in the buffer to partially fill the fixed-length packet, and then performs the retrieving, compressing, and storing operations to fill a remainder of the fixed-length packet.

12. The computer system of claim 8, wherein the internal decompression mechanism is configured to:

receive the fixed-length packet for the identified channel from the compression mechanism; and in a round-robin pattern, for each channel,
retrieve a variable-length word from a fixed-length packet;
decompress the variable-length word; and
upon determining that there is insufficient data in a fixed-length packet to enable decompressing variable-length words for the channel, send a request to the compression mechanism to cause the compression mechanism to output a fixed-length packet for the channel.

13. The computer system of claim 8, wherein upon starting compressing a new input bit stream, the internal decompression mechanism is further configured to send requests to the compression mechanism indicating that a fixed-length packet is needed to continue decompression for each of the channels.

14. The computer system of claim 8, wherein the compression mechanism is further configured to store the output stream in a computer-readable storage device or output the output stream to a network;

wherein a separate remote decompression mechanism subsequently retrieves the output stream from the computer-readable storage device or receives the output stream from the network and decompresses the output stream to recreate the input bit stream.

15. A method for performing data compression in a system with a compression mechanism with N channels that includes an internal decompression mechanism, wherein the internal decompression mechanism accepts N channels of fixed-length packets, comprising:
- receiving an input bit stream that includes a set of data words; and
- in response to receiving a request from the internal decompression mechanism identifying at least one of the channels for which a fixed-length packet is needed to be appended to the output stream:
  - filling a fixed-length packet for the identified channel with compressed data words;
  - appending the fixed-length packet to the output stream; and
  - forwarding a copy of the fixed-length packet to the internal decompression mechanism.

16. The method of claim 15, wherein filling the fixed-length packet for the identified channel involves:
- retrieving data words from the input bit stream;
- compressing each of the retrieved data words into a variable-length word; and
- appending the variable-length words in a round-robin pattern into a fixed-length packet for each of the channels, until the fixed-length packet is full.

17. The method of claim 16, wherein appending the variable-length words in the round-robin pattern into a fixed-length packet for each channel involves storing the variable-length words in a fixed-length packet for each channel until a fixed-length packet for the channel is full, then storing subsequent variable-length words into a buffer associated with the channel.

18. The method of claim 17, wherein if variable-length words are available in the buffer associated with the channel, filling a fixed-length packet for a channel involves:
- if sufficient variable-length words are available in the buffer to fill a fixed-length packet for the channel, filling the fixed-length packet with the available variable-length words from the buffer, appending the full fixed-length packet to an output stream of fixed-length packets, and forwarding a copy of the filled fixed-length packet to the internal decompression mechanism;
- otherwise, using the variable-length words in the buffer to partially fill the fixed-length packet, and then performing the retrieving, compressing, and storing operations to fill a remainder of the fixed-length packet.

19. The method of claim 15, wherein the method further comprises:
- receiving the fixed-length packet for the identified channel at the internal decompression mechanism; and
- in the internal decompression mechanism, for each channel in a round-robin pattern, for each channel
  - retrieving a variable-length word from a fixed-length packet;
  - decompressing the variable-length word; and
  - upon determining that there is insufficient data in a fixed-length packet to enable decompressing variable-length words for the channel, sending a request for a next fixed-length packet for the channel.

20. The method of claim 15, wherein upon starting compressing a new input bit stream, the method further comprises sending requests from the internal decompression mechanism identifying that a fixed-length packet is needed for each of the channels to continue decompression.

21. The method of claim 15, wherein the method further comprises:
- storing the output stream in a computer-readable storage device or outputting the output stream to a network;
- at a separate remote decompression mechanism, subsequently retrieving the output stream from the computer-readable storage device or receiving the output stream from the network; and
- using the separate remote decompression mechanism to decompress the output stream to recreate the input bit stream.

* * * * *